United States Patent [19]

Hoffmann et al.

[11] Patent Number: 5,089,194
[45] Date of Patent: Feb. 18, 1992

[54] PROCESS FOR PRODUCING CERAMIC FILM CASTING MIXTURES FOR THIN-FILM CIRCUITS

[75] Inventors: Carl Hoffmann; Dieter Grote, both of Marktredwitz, Fed. Rep. of Germany

[73] Assignee: Hoechst CeramTec Aktiengesellschaft, Selb, Fed. Rep. of Germany

[21] Appl. No.: 537,840

[22] Filed: May 25, 1990

Related U.S. Application Data

[62] Division of Ser. No. 326,650, Mar. 21, 1989, abandoned.

[30] Foreign Application Priority Data

Mar. 23, 1988 [DE] Fed. Rep. of Germany ....... 3809693

[51] Int. Cl.$^5$ ............................................. C04B 35/10
[52] U.S. Cl. .................................... 264/63; 264/166; 241/29
[58] Field of Search ................ 264/63, 166; 241/29, 241/24, 21, 15, 16, 22, 27; 156/89

[56] References Cited

U.S. PATENT DOCUMENTS

| | | |
|---|---|---|
| 3,698,923 | 10/1972 | Stetson et al. |
| 3,895,963 | 7/1975 | McGowan et al. ............... 264/63 X |
| 3,972,480 | 8/1976 | Powers ................... 241/15 |
| 4,045,412 | 8/1977 | Yamada et al. ......................... 264/63 |
| 4,678,702 | 7/1987 | Lancaster et al. |
| 4,786,342 | 11/1988 | Zellner ................................. 156/89 |
| 4,797,270 | 1/1989 | Cendan et al. ..................... 241/27 X |

OTHER PUBLICATIONS

J. C. Williams, "Doctor-Blade Process", Treatise on Materials Science & Technology, vol. 9, Ceramic Fabrication Processes, 1976, Academic Press, Inc., New York.

*Primary Examiner*—James Derrington
*Attorney, Agent, or Firm*—Foley & Lardner

[57] ABSTRACT

To produce $Al_2O_3$-containing ceramic film casting mixtures for thin-film circuits, unground, calcined alumina with low primary particle size and high reactivity is ground, optionally together with a solvent mixture, then the binder or a mixture of a plurality of different binders and the plasticizer or a mixture of a plurality of different plasticizers are added and the mixture is ground again until the alumina reaches a particle size of 2-10 μm. The alumina, optionally together with a sintering aid, may first be ground alone in the solvent or the solvent mixture for 24 to 72 hours. The sintering aid or sintering aids may also be first ground in the solvent or the solvent mixture and the alumina added to the suspension obtained.

15 Claims, No Drawings

PROCESS FOR PRODUCING CERAMIC FILM CASTING MIXTURES FOR THIN-FILM CIRCUITS

This application is a division, of application Ser. No. 07/326,650, filed Mar. 21, 1989 now abandoned.

DESCRIPTION

The invention relates to a process for producing casting mixtures for ceramic films containing $Al_2O_3$ as main ceramic component.

Thick- and thin-film circuits are produced by depositing conductor tracks, resistors and discrete electronic components such as transistors, diodes, etc. on ceramic plates, in particular ones made of aluminum oxide.

In the case of thick-film circuits, metal-containing pastes are deposited by means of screen printing using a suitable mask. After said pastes have been baked in at temperatures up to approx. 1000° C., the conductor tracks and resistors have film thicknesses of approx. 10 to 30 μm.

If, however, the films are vapor-deposited or sputtered on, their film thickness is below 1 μm, normally below 0.1 μm. In this case the term thin-film circuits is used. A method for producing such substrates for thin-film circuits is, for example, described in U.S. Pat. No. 3,698,923.

Very high requirements, in particular with regard to the surface roughness $R_a$, are imposed on the surface structure of the ceramic substrates which are to be used for such thin-film circuits ($R_a$ should be <0.15 μm).

Hitherto it was not possible to produce suitable thin-film substrates directly in a continuous process (see for example, "Doctor-Blade Process", J. C. Williams, Treatise on Materials Science and Technology, Vol. 9, Ceramic Fabrication Processes, 1976, Academic Press, INC., New York), for example on a circulating steel strip since it was not possible for the film mixtures to be dried in acceptable times on the circulating strip and, as a consequence, had cracks or crevices or did not detach themselves, or detached themselves only with great difficulty, from the steel strip. In order nevertheless to be able to pour such thin-film film casting mixtures in a continuous process on a steel strip, the casting mixture was poured onto a Mylar film lying directly on the steel strip, then pre-dried, cut and hung up to dry out together with the Mylar film. The Mylar film was subsequently peeled off and discarded before the individual substrates were fired. The use of this non-reusable Mylar film made the continuous production process for thin-film substrates considerably more expensive.

On the other hand, it was not possible for film casting mixtures for thick-film substrates (which it has hitherto also been possible just to pour directly onto steel strips) to be used to produce thin-film circuits since the surface roughnesses of the substrate obtained were unduly high. U.S. Pat. No. 4,678,702 discloses a process for producing ceramic films with smooth surface for electrical circuits. The film mixture contains pure $Al_2O_3$ with particle sizes of less than 1 μm. Substrates with a roughness of 25-30 nm are obtained.

The present invention was based on the object of providing film casting mixtures for thin-film circuits which can be poured directly onto the continuously traveling steel strip even without using a throw-away film and nevertheless comply with the high requirements imposed on substrates for thin-film circuits.

This object is achieved by a process for producing $Al_2O_3$-containing ceramic film casting mixtures for thin-film circuits which comprises grinding the unground, calcined alumina with a primary particle size of less than 1 μm, optionally together with a sintering aid, in a solvent or a solvent mixture, then adding the binder or a mixture of a plurality of different binders and the plasticizer or a mixture of a plurality of different plasticizers and grinding again.

Possible ceramic basic materials for thin-film circuits are, in particular, aluminas, in particular those having an $Al_2O_3$ content of $\geq 99\%$.

Due to the calcination of the aluminas, they contain agglomerates and aggregates up to sizes of 100 μm and over. In principle, it is possible to grind these aluminas down to their primary particle size with suitable grinding units. For the purpose envisaged, calcined aluminas with a primary particle size of <1 μm are preferred in this connection. The grinding is capable of achieving specific surfaces of >10 m²/g and this leads to an increase in the sintering activity.

"Solvents" are understood to mean all the solvents normally used in the production of ceramic film casting mixtures, such as water, methanol, ethanol, isobutanol, trichloroethylene, trichloroethane or toluene. Normally, a menhaden fish oil is added as a dispersant and release agent.

Normally used binders are, for example, polyvinylbutyrals, i.e. terpolymers which contain approx. 0.5 to 3% by weight of vinyl acetate units and 12 to 28% by weight of vinyl alcohol units in addition to vinyl butyral units.

The following may be used, for example, as plasticizers: esters of dicarboxylic acids such as phthalic acid, adipic acid or sebacic acid with aliphatic and/or aromatic alcohols such as butanol, hexanol or benzyl alcohol, but also corresponding esters of phosphoric acid or esters of monocarboxylic acids with polyhydric alcohols such as the esters of triethylene glycol with aliphatic monocarboxylic acids containing 6 to 8 carbon atoms and ethers of long-chain alcohols such as the monoisotridecyl ether of triethylene glycol.

The unground, calcined alumina is ground together with a solvent or a solvent mixture to particle sizes of 2 to 10 μm. If a drum mill is used, the duration of grinding varies, depending on the type and size of the grinding bodies used, from 24 to 72 hours, preferably 40 to 56 hours. If drum mills are used, grinding bodies made of alumina ($Al_2O_3$) are preferably used. If sintering aids such as magnesium oxide, silicon dioxide, zirconium dioxide or the like are also used in addition to the ceramic basic material (alumina) it has proved advantageous to first suspend them for approx. ½ to 2 hours in the solvent or solvents before adding the basic material (alumina) in order to achieve a more uniform distribution in the ceramic basic material. At the same time, the sintering aids should be wetted and uniformly distributed in the liquid phase. Lumps which are formed or added should disappear. The suspension may preferably be carried out directly in the drum mill containing grinding bodies.

The grinding of the alumina, optionally after previously suspending the sintering aids, is followed by the addition of the binder or of the mixture of different binders and of the plasticizer or the different plasticizers. Binder and plasticizer may optionally be premixed for 10 to 60 minutes before the addition. The entire mixture is then ground again, the grinding duration being preferably 12 to 72, in particular 12 to 78 hours.

The casting mixture thus prepared can now readily be poured onto a continously traveling steel strip (speed 10 to 50 cm/min, preferably 20 to 40 cm/min) using a casting shoe to form films 0.7 to 1.4 mm, preferably 0.8 to 1.3 mm thick. After traversing a drying path 10 to 40 m, preferably 15 to 30 m long, with a temperature gradient increasing from 15° to 80° C., preferably from 15° to 65° C., the "green film" can readily be separated from the steel strip and either be rolled up into rolls or stamped out to form large cards. These "green films" can then be further processed by known methods and are finally fired at 1500° to 1550° C., preferably at 1510° to 1520° C.

The substrates produced according to the invention for thin-film circuits are characterized by
resistance to the temperatures and chemicals encountered in the production process (for example during the deposition of the conductor tracks),
chemical inertness towards the films deposited,
good electrical insulation capacity,
low surface roughness $R_a$ (<0.2 μm),
mechanical strength (flexural breaking strength >400 N/mm$^2$),
good thermal shock resistance,
good thermal conductivity,
low range of variation of the dielectric constants.

The invention is explained in more detail in the example below.

EXAMPLE

All the weight percentage data are based on 100% of the dry ceramic mixture, including sintering aids.

1.06 kg of steatite (Steawhite 200, manufacturer: Cyprus Industrial Minerals Corporation, USA) are ground for one hour with 48.34 kg (32.0% by weight) of trichloroethylene, 19.64 kg (13.0% by weight) of ethanol and 2.42 kg (1.6% by weight) of fish oil Kellox Z3 (manufacturer: Kellog, USA) in a drum mill filled with 200 kg of grinding bodies A195TB (cylinder, ϕ 20 mm, height 20 mm; manufacturer: Dyko Düsseldorf). Then 150 kg of alumina CT 3000 (manufacturer: Alcoa, Ludwigshafen) are added and ground for 48 hours (alumina + steatite = 100% by weight).

Independently of this, 7.55 kg (5.00% by weight) of Butvar ® B 98 (a polyvinylbutyral; manufacturer: Hoechst, Frankfurt) and 4.83 kg (3.2% by weight) of Palatinol ® AH (dioctyl phthalate; manufacturer: BASF, Ludwigshafen) are mixed for 25 minutes and then introduced together with 5.44 kg (3.6% by weight) of Ucolub S-140 (polyethylene glycol; manufacturer: BRENNTAG Mineralöl GmbH, Mülheim an der Ruhr) into the drum mill and ground for a further 24 hours.

The viscosity of the casting slick thus prepared before being discharged from the drum is approx. 3500 cp (at 21° C.). The mixture is poured onto a steel strip traveling at a speed of 30 cm/min (film thickness: 0.84 mm). The film is dried on a length of approx. 10 m with a temperature gradient rising from 21° to 60° C. It can either be wound up onto rolls or stamped out to form large cards. The flexibility of this "green film" is still ensured weeks later.

The "green substrates" are sanded with a spinel release agent (described in the simultaneously filed U.S. patent application having the internal reference number HOE 88/C 005), laid on firing plates in 11 layers and fired at 1520° C. (thickness of the substrates after firing: 0.69 mm).

The mixture may also be poured in a thickness of 1.2 mm (rough dimension).

After firing, the lowermost substrate is discarded. The substrates are laser-cut to the required dimensions. Before and after the laser cutting, the substrates are brushed and then afterfired at 1400° C.

| Chemical composition of the fired substrates: | |
|---|---|
| Al$_2$O$_3$ | ≧99% |
| MgO | approx. 0.3% |
| SiO$_2$ | approx. 0.4% |
| Na$_2$O | max. 0.2% |

| Physical properties of the fired substrates: | |
|---|---|
| Water absorption capacity [%] | 0 |
| Gross density (specific gravity) [kg/cm$^3$] | 3.84 |
| Linear coefficient of expansion | |
| between 20 and 100° C. | 5.5 × 10$^{-6}$ [1/K] |
| between 20 and 300° C. | 6.7 × 10$^{-6}$ [1/K] |
| between 20 and 600° C. | 7.5 × 10$^{-6}$ [1/K] |
| between 20 and 1000° C. | 8.3 × 10$^{-6}$ [1/K] |
| Flexural breaking strength [N/mm$^2$] (as specified in DIN 40 685) | >400 |
| Maximum particle size (REM) [μm] | 4 |
| Surface roughness $R_a$ [μm] | 0.16 to 0.19 |

We claim:
1. A process for production of an Al$_2$O$_3$-containing substrate for thin-film circuits, which substrate has a maximum particle size of about 4 μm, a flexural breaking strength of more than about 400 N/mm$^2$, and a surface roughness $R_a$ of less than about 0.2 μm, comprising the steps of:
   grinding agglomerated, calcined alumina having a primary particle size of less than 1 μm and having agglomerates ranging up to about 100 μm in a solvent or solvent mixture, to a particle size of about 2 to 10 μm;
   adding at least one binder and at least one plasticizer to the ground alumina to produce a slurry;
   grinding the slurry;
   continuously transferring the ground slurry directly onto a continuously-circulating steel strip having a velocity of about 10 to 50 cm/min with a casting shoe to form a film having a thickness of about 0.7 to 1.4 mm;
   drying the transferred slurry to a green tape in a drying path having a length of about 10 to 40 meters and a temperature gradient increasing from about 15° C. to about 80° C.;
   removing the green tape from the strip; and
   firing the green tape which has been removed from the strip at about 1500° to 1550° C.
2. The process as claimed in claim 1, wherein the alumina is ground in the solvent or the solvent mixture for 24 to 72 hours.
3. The process as claimed in claim 1, wherein an alumina having an Al$_2$O$_3$ content of >99% by weight is used.
4. The process as claimed in claim 1, wherein the calcined alumina is ground in the presence of a sintering aid.
5. The process as claimed in claim 4, wherein the sintering aid is first ground and suspended in the solvent or the solvent mixture and only then is the unground alumina added.

6. The process as claimed in claim 4, wherein the sintering aid is selected from the group consisting of magnesium oxide, silicon dioxide or zirconium dioxide.

7. The process as claimed in claim 1, wherein the speed of the steel strip is about 20 to 40 cm/min.

8. The process as claimed in claim 1, wherein the film thickness is about 0.8 to 1.3 mm thick.

9. The process as claimed in claim 1, wherein the drying path is about 15 to 30 meters long.

10. The process as claimed in claim 1, wherein the temperature gradient increases from about 15° C. to about 65° C.

11. The process as claimed in claim 1, wherein the green tape is fired at a temperature of about 1510° to 1520° C.

12. The process as claimed in claim 1, wherein the alumina is ground in the solvent or the solvent mixture for 40 to 56 hours.

13. The process as claimed in claim 1, wherein the slurry is ground for about 12 to 72 hours.

14. A process for production of an $Al_2O_3$-containing substrate for thin-film circuits, which substrate has a maximum particle size of about 4 μm, a flexural breaking strength of more than about 400 N/mm$^2$, and a surface roughness $R_a$ of less than about 0.2 μm, comprising the steps of:

grinding agglomerated, calcined alumina having a primary particle size of less than 1 μm and having agglomerates ranging up to about 100 μm in a solvent or solvent mixture for about 24 to 72 hours, to a particle size of about 2 to 10 μm and a specific surface area greater than about 10 m$^2$/g;

adding at least one binder and at least one plasticizer to the ground alumina to produce a slurry;

grinding the slurry for about 12 to 72 hours;

continuously transferring the ground slurry directly onto a continuously-circulating steel strip having a velocity of about 10 to 50 cm/min with a casting shoe to form a film having a thickness of about 0.7 to 1.4 mm;

drying the transferred slurry to a green tape in a drying path having a length of about 10 to 40 meters and a temperature gradient increasing from about 15° C. to about 80° C.;

removing the green tape from the strip; and firing the green tape which has been removed from the strip at about 1500° to 1550° C.

15. The process as claimed in claim 14, wherein the ground slurry is continuously transferred directly onto a continuously-circulating steel strip having a velocity of about 20 to 40 cm/min with a casting shoe to form a film having a thickness of about 0.8 to 1.3 mm; the transferred slurry is dried to a green tape in a drying path having a length of about 15 to 30 meters and a temperature gradient increasing from about 15° C. to about 65° C.; and the green tape is fired at about 1510° to 1520° C.

* * * * *